United States Patent
Kim

(10) Patent No.: US 7,656,725 B2
(45) Date of Patent: Feb. 2, 2010

(54) SEMICONDUCTOR MEMORY DEVICE WHICH COMPENSATES FOR DELAY TIME VARIATIONS OF MULTI-BIT DATA

(75) Inventor: Chan-kyung Kim, Gyeonngi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 350 days.

(21) Appl. No.: 11/790,582

(22) Filed: Apr. 26, 2007

(65) Prior Publication Data

US 2007/0201288 A1    Aug. 30, 2007

Related U.S. Application Data

(62) Division of application No. 11/010,325, filed on Dec. 14, 2004, now Pat. No. 7,227,808.

(30) Foreign Application Priority Data

Dec. 18, 2003    (KR) ............................... 2003-93176

(51) Int. Cl.
*G11C 7/00* (2006.01)

(52) U.S. Cl. .................. 365/194; 365/189.05; 365/154; 365/233.11

(58) Field of Classification Search ................ 365/194, 365/233.1, 83, 219, 233, 154, 189.05
See application file for complete search history.

(56) References Cited

U.S. PATENT DOCUMENTS

| | | | |
|---|---|---|---|
| 4,949,361 A | 8/1990 | Jackson | |
| 5,502,720 A * | 3/1996 | Muramatsu | 370/412 |
| 5,619,148 A | 4/1997 | Guo | |
| 6,084,447 A | 7/2000 | Graf, III | |
| 6,339,353 B1 | 1/2002 | Tomita et al. | |
| 6,556,494 B2 | 4/2003 | Morzano et al. | |
| 6,839,859 B2 | 1/2005 | Kouchi et al. | |
| 6,847,567 B2 | 1/2005 | Kang | |
| 7,072,821 B1 | 7/2006 | Manz et al. | |
| 2002/0122348 A1 | 9/2002 | Lee et al. | |
| 2003/0035502 A1 | 2/2003 | Boerker | |
| 2005/0008111 A1 | 1/2005 | Suzuki | |

FOREIGN PATENT DOCUMENTS

| | | |
|---|---|---|
| JP | 11177541 | 7/1999 |
| KR | 1020020095686 A | 12/2002 |
| KR | 1020030000836 A | 1/2003 |

* cited by examiner

*Primary Examiner*—Pho M Luu
*Assistant Examiner*—Tha-O Bui
(74) *Attorney, Agent, or Firm*—Volentine & Whitt, PLLC

(57) ABSTRACT

A memory device compensates for delay time variations among multi-bit data. The device includes a first stage and a second stage of data storage units. The first stage of data storage units store first to nth data bits in response to a latch clock signal. The second stage of data storage units store the first to nth data contents output from the first stage of data storage units in response to a reference clock signal. The latch clock signal is obtained by delaying the reference clock signal. The latch clock signal includes first to nth sub latch signals. The sub latch signals are generated at different times according to propagation delay time periods of the corresponding first to nth data contents.

12 Claims, 6 Drawing Sheets

SEMICONDUCTOR MEMORY DEVICE WHICH COMPENSATES FOR DELAY TIME VARIATIONS OF MULTI-BIT DATA

CROSS REFERENCES TO RELATED APPLICATIONS

This is a divisional application of U.S. Patent Application 11/010,325, filed 14 Dec. 2004, and issued as U.S. Pat. No. 7,227,808, and also claims priority under 35 U.S.C. § 119 from Korean Patent Application No. 2003-93176, filed on Dec. 18, 2003, the contents of which are hereby incorporated by reference in their entirety for all purposes as if fully set forth herein.

BACKGROUND AND SUMMARY

1. Technical Field

Embodiments of the present invention relate to a semiconductor memory device which stores data of various widths, which is capable of compensating for delay time variations between input data bits when processing multi-bit data.

2. Description of the Related Art

Semiconductor memory devices are capable of simultaneously processing multi-bit data using a single semiconductor chip. An example of this type of device is a YDRAM (Yellowstone Dynamic Random Access Memory). Processing multi-bit data means that a single semiconductor chip can simultaneously support X16, X8, X4, X2 and X1 data modes. Supporting an X16 mode means that a semiconductor memory device can receive and process 16 bits of data at a time. Likewise, supporting an X1 mode means that a semiconductor memory device can receive and process one bit of data at a time. In a semiconductor memory device capable of simultaneously processing multi-bit data, the propagation delay time of input data is longer when the semiconductor memory device operates in a X1 mode than when the device operates in a X16 mode. This deteriorates the timing margin of the flip-flops that receive the data.

FIGS. 1(a), (b), (c), (d) and (e) illustrate a semiconductor memory device operating in an X16 mode, X8 mode, X4 mode, X2 mode and X1 mode, respectively. The numerals shown in FIG. 1 denote pin numbers of the semiconductor memory device. If the semiconductor memory device operates in the X16 mode, as shown in FIG. 1(a), data is input into each of the 16 pins and the input data is applied to an internal circuit (not shown) from each pin.

In FIG. 1(a), td1 denotes the period of time required for data outputted from each pin of the semiconductor memory device to be delivered to an input buffer (not shown) of the internal circuit (not shown). If a semiconductor memory device operates in the X1 mode, as shown in FIG. 1(e), data is input to one of 16 pins of the semiconductor memory device (pin 0 in this case) and the input data is transmitted from the pin 0 to the internal circuit (not shown). Considering an internal circuit that is located the furthest distance from the pin 0, the period of time required for data output from the pin 0 of the semiconductor memory device operating in X1 mode to be transmitted to the input buffer (not shown) of the internal circuit (not shown) is represented by td2+td3.

As described above, the period of time required for data to be applied to the input buffer (not shown) (i.e. propagation time), largely depends on whether the semiconductor memory device operates in the X16 mode or the X1 mode. Since the frequency of a reference clock signal for operating the semiconductor memory device does not depend on whether the semiconductor memory device operates in the X16 mode or in the X1 mode, the margin of the input data may be poor, and the set-up and hold time characteristics of the input data may deteriorate due to a long propagation delay time. The propagation delay time may vary with the position of the internal circuit of the semiconductor memory device, even in the same operating mode. Referring to FIG. 1(e), the period of time required for the data to be input into the input buffer (not shown) of the internal circuit (not shown) located the furthest distance from the pin 0 is td2+td3. However, the period of time required for the data to be transmitted to the input buffer (not shown) of the internal circuit (not shown) having the shortest distance from the pin 0 is td4.

As described above, the time required for the data to be applied to the input buffer (not shown) of the internal circuit (not shown) (i.e., the propagation delay time), may vary according to the position of the internal circuit, even when the semiconductor memory device operates in the same operating mode. Because a reference clock signal for operating the semiconductor memory device has a specific frequency that does not vary in the same operating mode, the margin of the input data may become poor and the set-up and hold time characteristics of the input data may deteriorate due to a long propagation delay time.

FIG. 2 shows a portion of a semiconductor memory device for illustrating the propagation time difference, with reference to FIG. 1. FIG. 3 is a timing diagram illustrating the operation of the semiconductor memory device shown in FIG. 2.

Referring to FIG. 2, the semiconductor memory device 200 includes flip-flops FF11, FF21, FFn1, FF12, FF22, FFn2, FF13, FF23 and FFn3 that receive and store first to nth data bits D<1>, D<2>, . . . , D<n>. The flip-flips FF11, FF21, FFn1, FF12, FF22, FFn2, FF13, FF23 and FFn3 store the first to nth data bits D<1>, D<2>, . . . , D<n>in response to a reference clock signal REFCK. D1_1, D2_1 and Dn_1 denote data contents that result from delay of the first to nth data D<1>, D<2>, . . . , D<n> for different periods of time. The data bits D1_1, D2_1 and Dn_1 are input into the flip-flops FF11, FF21 and FFn1, located at a first stage. Reference numerals t1, t2 and tn respectively represent periods of time required for the first to nth data bits D<1>, D<2>, . . . , D<n> to be input into the flip-flops FF11, FF21 and FFn1 at the first stage.

The second data bit D<2> takes the shortest amount of time to arrive at the flip-flop FF21 and the nth data D<n> takes the longest amount of time to reach the flip-flop FFn1. The period of time required by the first data D<1> to be input into the flip-flop FF11 is in-between the time periods required for the second data D<2> and the nth data bit D<n>. The data bits D<1>, D<2>, . . . , D<n> require different time periods to be input into the flip-flops FF11, FF21 and FFn1, located at the first stage in the semiconductor memory device 200, because data input pins (not shown) have different distances from the flip-flops FF11, FF21 and FFn1, as illustrated in FIG. 1. The time periods required for the data bits D<1>, D<2>, . . . , D<n> to be input into the flip-flops FF11, FF21 and FFn1 may vary in different operating modes of the semiconductor memory device, such as the X16 mode and the X1 mode.

FIG. 3 shows delay time t1 of the first data bit D<1>, delay time t2 of the second data bit D<2>, and delay time tn of the nth data bit D<n>, corresponding to data waveforms. In FIG. 3, the uppermost waveform illustrates the first to nth data bits D<1>, D<2>, . . . , D<n> having the same delay time and being simultaneously applied to the first-stage flip-flops FF11, FF21 and FFn1. It can be seen from FIG. 3 that the nth data bit Dn_1 with the longest delay time has the shortest set-up time Sn, and the second data D2_1 with the shortest delay time has the longest set-up time S2. If there is a delay time difference among the data contents, data having long delay times will not be able to be stored in a corresponding flip-flop, in response to the reference clock signal REFCK. Likewise, data having short delay times may have no difficulty in being stored in a corresponding flip-flop, in response to the reference clock signal REFCK.

So, the propagation delay time of the data may become problematic in the front-stage flip-flops FF11, FF21 and FFn1 of the semiconductor memory device 200. That is, if the data is properly stored in the front flip-flops FF11, FF21 and FFn1 based on a single reference clock signal REFCK pulse, even though the data bits have different propagation delay time intervals, the data output from the flip-flops FF11, FF21 and FFn1 may then be stored in the flip-flops FF12, FF22 and FFn2 at the next stage, in response to a subsequent the reference clock signal REFCK pulse without any problem.

FIG. 4A is a timing diagram illustrating the case where there is a small propagation delay time difference between all data bits input to the semiconductor memory device of FIG. 2. FIG. 4B is a timing diagram illustrating a case where there is a large propagation delay time difference between at least some of the data bits input to the semiconductor memory device of FIG. 2.

Referring to FIG. 4A, when the first to nth data bits (D<1> to D<n>) all have small propagation delay time differences, all of the data bits can be stored in the flip-flops FF11, FF21 and FFn1 at the first stage, although they have different set-up and hold time characteristics. In contrast, as shown in FIG. 4B, however, when at least some of the first to nth data bits (D<1> to D<n>) have a large propagation delay time difference, even though the first and second data D<1> and D<2> are stored in the corresponding front flop-flops FF11 and FF21 in response to the reference clock signal REFCK, at least the nth data D<n> cannot be stored in the front flip-flop FFn1 in response to the reference clock signal REFCK because of its long propagation delay time.

As described above, all of data contents cannot be latched using a single reference clock signal REFCK when the propagation delay time of multi-bit data input into the semiconductor memory device 200 is increased and the propagation delay time difference among multi-bit data contents becomes large.

Accordingly, it would be desirable to provide a semiconductor memory device capable of compensating for delay time differences in multi-bit data input to a memory device, by adjusting the magnitude of delay of a reference clock signal for controlling flip-flops of a front stage.

According to one aspect of the present invention, a semiconductor memory device includes first and second data storage units. The first data storage unit stores first to nth data input into the first data storage unit, in response to a latch clock signal. The second data storage unit stores the first to nth data output from the first data storage unit, in response to a reference clock signal. The latch clock signal is obtained by delaying the reference clock signal. The latch clock signal includes first to nth sub latch clock signals. The first to nth sub latch clock signals are generated at different points in time, according to propagation delay time periods of the first to nth data contents that respectively correspond to the first to nth sub latch clock signals. The first data storage unit includes first to nth storage elements which store the first to nth data, in response to the respective first to nth sub latch clock signals.

The first to nth programmable delays delay the reference clock signal to generate the respective first to nth sub latch clock signals. The first to nth programmable delays determine the delay time of the reference clock signal, according to propagation delay time periods of the first to nth data applied to the first to nth programmable delays. In embodiments, the first to nth programmable delays determine degrees of delaying the reference clock signal for generating the first to nth sub latch clock signals, according to a fuse option. In embodiments, the first to nth programmable delays determine degrees of delaying the reference clock signal for generating the first to nth sub latch clock signals, according to MRS (Mode Register Set). The number of bits of data input into the semiconductor memory device may be selected according to the operation mode of the semiconductor memory device.

According to another aspect of the present invention, a semiconductor memory device is compensating delay time of multi-bit data, which has a plurality of data paths for receiving data. Each of the plurality of data paths include a plurality of data storage units for storing input data. The first data storage units of the plurality of data paths store the data in response to a latch clock signal. Data storage units (other than the first data storage units) store the data output from the first data storage units in response to a reference clock signal. The latch clock signal is obtained by delaying the reference clock signal. The latch clock signal may include as many sub latch clock signals as the number of data paths. The sub latch clock signals are generated at different points of time according to propagation delay time of the data input into the corresponding data paths.

The semiconductor memory device may include a plurality of programmable delays which delay the reference clock signal to generate the sub latch clock signals. The plurality of programmable delays determine delay time of the reference clock signal according to propagation delay time of the data input to a corresponding data path. In embodiments, the programmable delays determine degrees of delaying the reference clock signal for generating the sub latch clock signals, according to a fuse option. In embodiments, the programmable delays determine degrees of delaying the reference clock signal for generating the first to nth sub latch clock signals, according to a MRS (Mode Register Set). The number of data paths for receiving data can be selected according to the operation mode of the semiconductor memory device.

According to yet another aspect of the present invention, a semiconductor memory device compensates delay time of multi-bit data, which has a plurality of data paths for receiving data, in which each of the plurality of data paths includes a plurality of data storage units for storing input data. The first data storage units of the plurality of data paths operate asynchronously, while other data storage units operate synchronously. The first data storage units store the data in response to a latch clock signal. The other data storage units store the data output from the first data storage units in response to a reference clock signal. The sub latch clock signal is obtained by delaying the reference clock signal. The sub latch clock signals are generated at different of times according to propagation delay time of the data input into a corresponding data path.

The semiconductor memory device may include a plurality of programmable delays for delaying the reference clock signal to generate the sub latch clock signals. The plurality of programmable delays determine delay time of the reference clock signal according to propagation delay time of the data input into a corresponding data path. In embodiments, the programmable delays determine degrees of delaying the reference clock signal for generating the sub latch clock signals, according to a fuse option. In embodiments, the programmable delays determine degrees of delaying the reference clock signal for generating the first to nth sub latch clock signals, according to MRS (Mode Register Set). The number of data paths for receiving data may be selected according to the operation mode of the semiconductor memory device.

BRIEF DESCRIPTION OF THE DRAWINGS

The above and other features and advantages of embodiments of the present invention will become more apparent by the description in detail example embodiments thereof with reference to the attached drawings, in which.

DETAILED DESCRIPTION OF THE INVENTION

In the following detailed description, embodiments of the invention are shown and described by way of illustration of the best mode contemplated by the inventor(s) of carrying out the invention. As will be realized, the invention can be modified in various aspects without departing from the invention. Accordingly, the drawings and description are to be regarded as illustrative in nature, and not restrictive.

Figure 5:
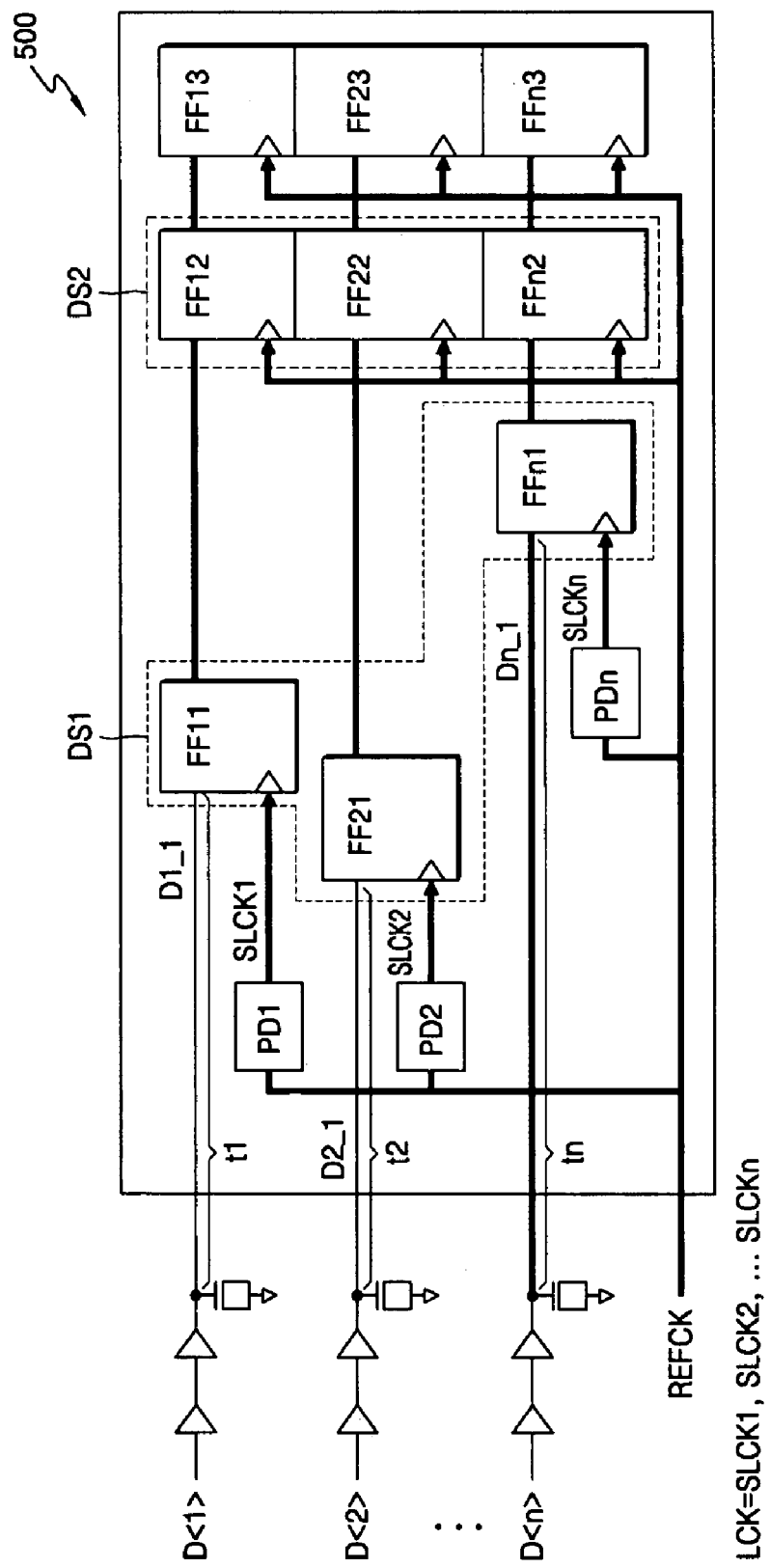
FIG. 5 shows a semiconductor memory device, according to one or more aspects of the present invention.
Figure 6:
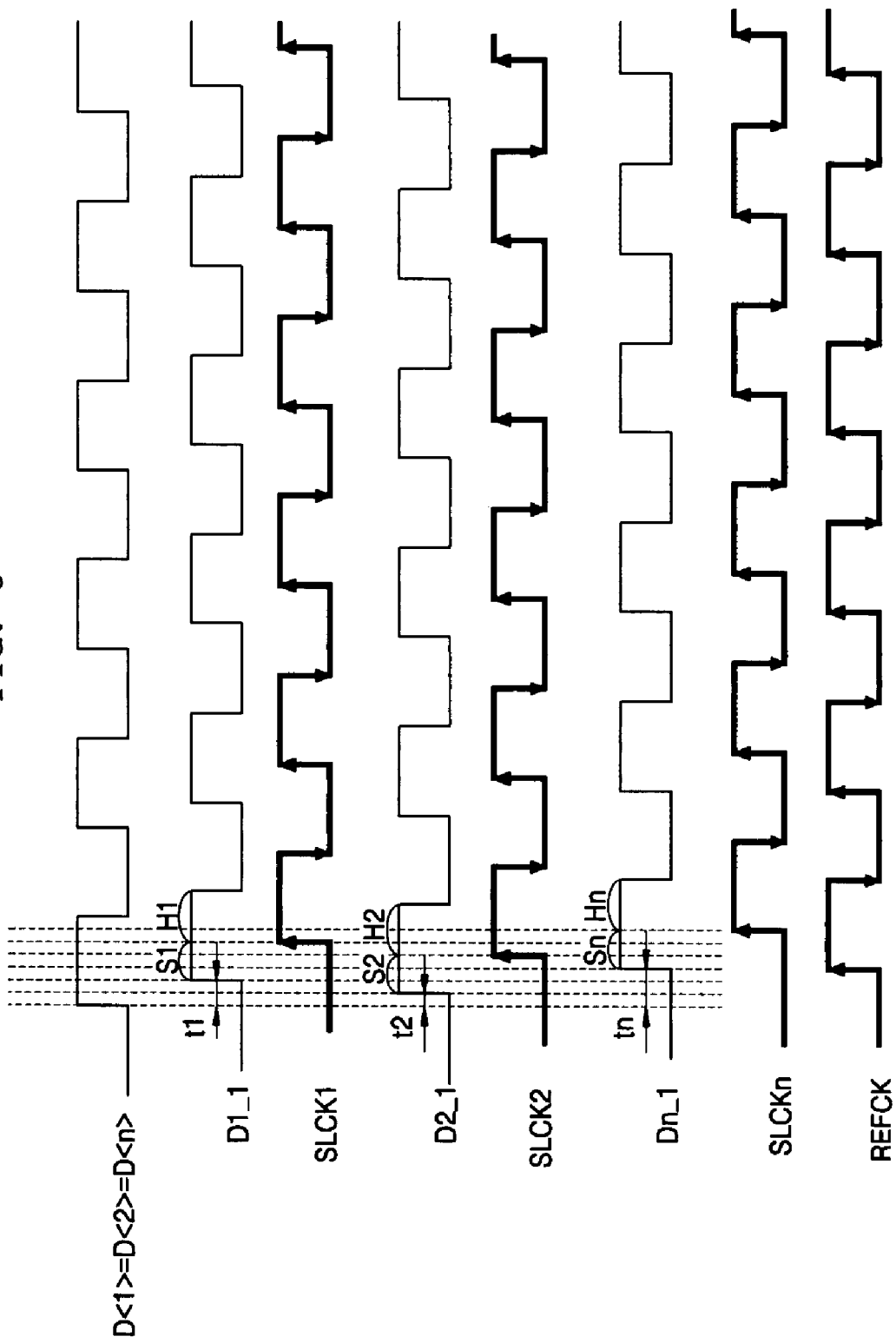
FIG. 6 is a timing diagram illustrating the operation of the semiconductor memory device shown in FIG. 5.

FIG. 5 shows a semiconductor memory device. FIG. 6 is a timing diagram of the operation of the semiconductor memory device shown in FIG. 5.

Referring to FIG. 5, the semiconductor memory device 500 includes first and second data storage units DS1 and DS2.

The number of bits of data input into the semiconductor memory device 500 can be selected according to the operating mode of the semiconductor memory device. The semiconductor memory device 500 shown in FIG. 5 is a semiconductor memory device capable of processing multi-bit data simultaneously, which means that the semiconductor memory device 500 simultaneously can support X16, X8, X4, X2 and X1 modes.

The first data storage unit DS1 stores first to nth data bits D<1>, D<2>, ..., D<n> input in response to a latch clock signal LCK. In FIG. 5, data bits D1_1, D2_1 and Dn_1 are delayed versions of the first to nth data bits D<1>, D<2>, ..., D<n> for propagation delay time periods t1, t2 and tn, respectively. The second data storage unit DS2 stores the first to nth data bits D<1>, D<2>, ..., D<n> output from the first data storage unit DS1 in response to a reference clock signal REFCK.

The latch clock signal LCK is obtained by delaying the reference clock signal REFCK.

Figure 1:
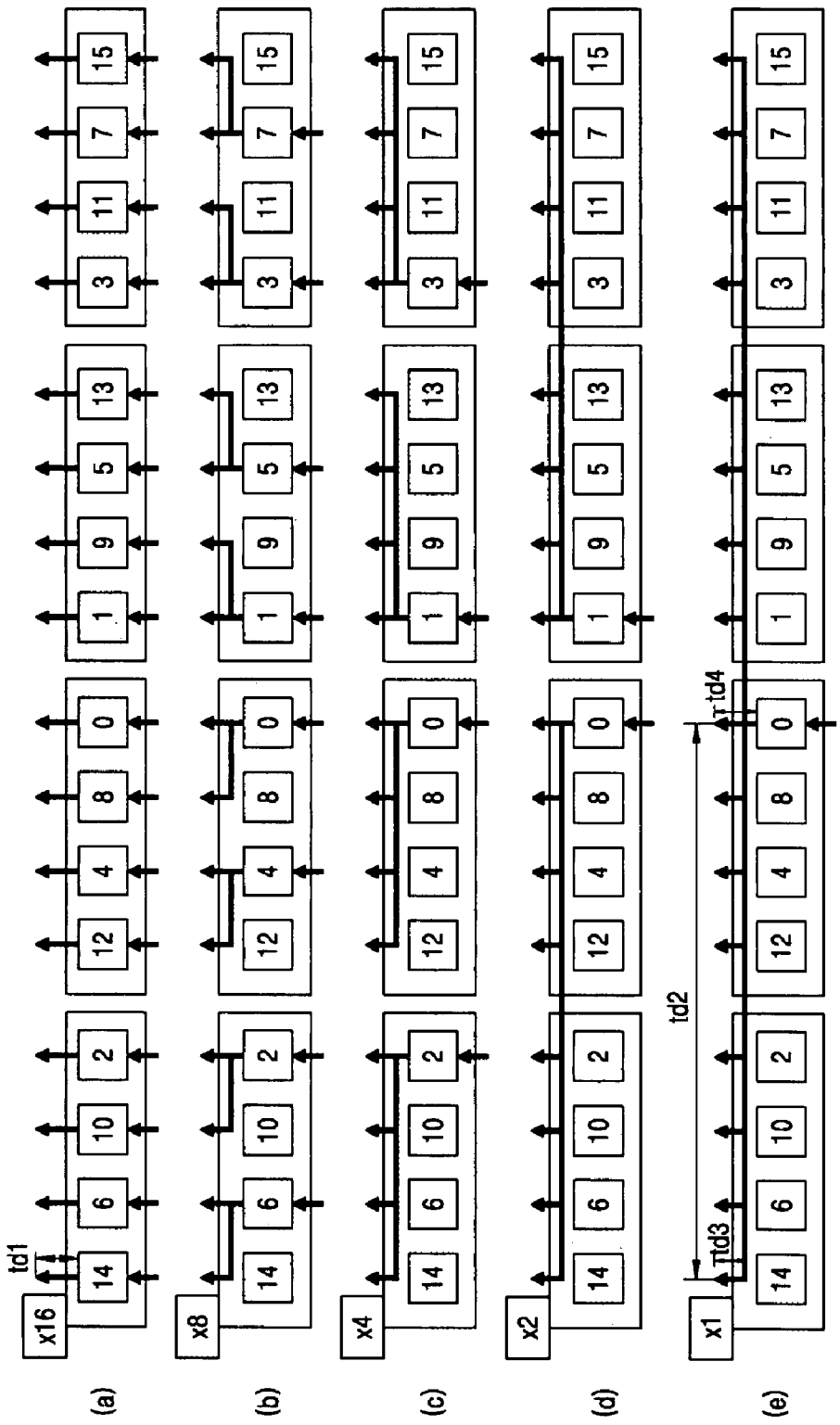
FIG. 1 is a diagram illustrating a semiconductor memory device capable of simultaneously processing multi-bit data.
Figure 2:
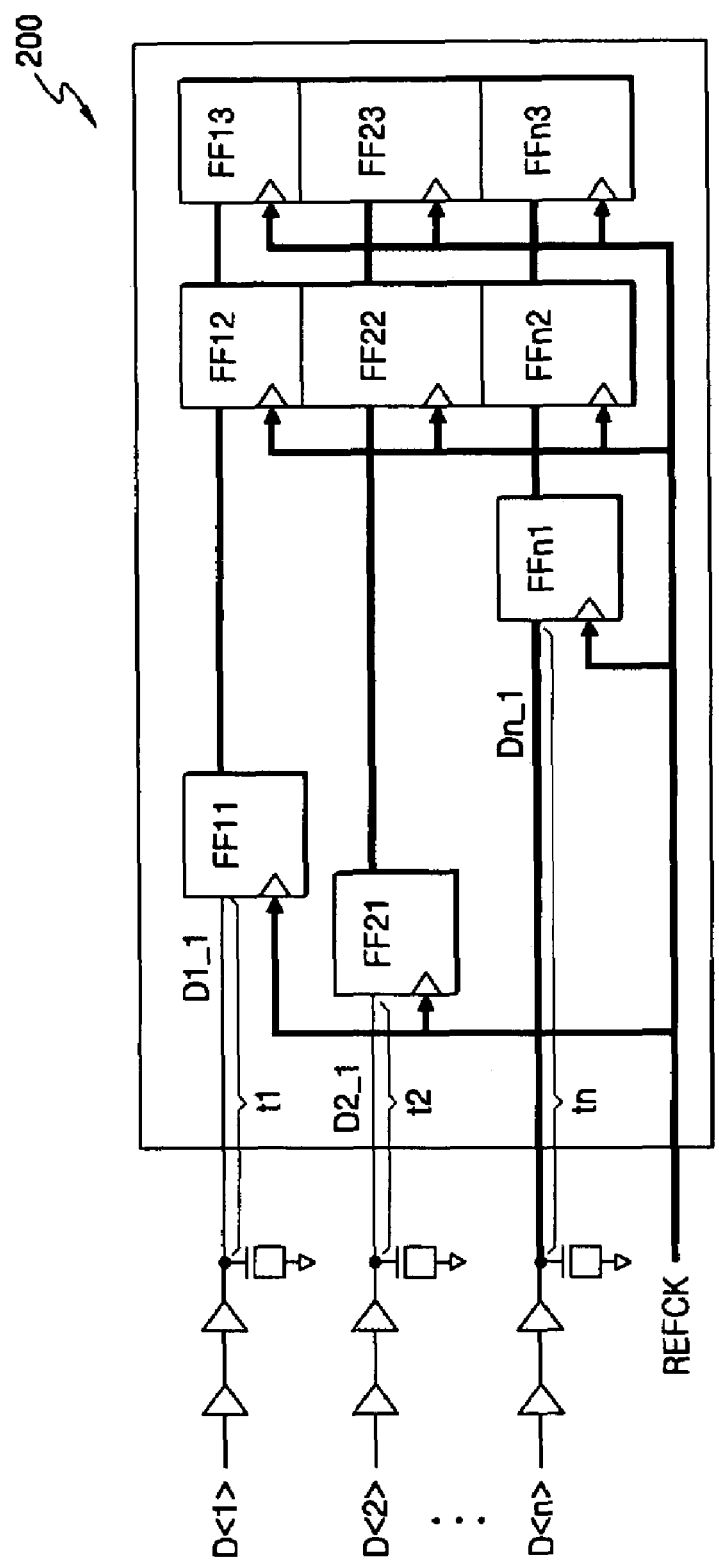
FIG. 2 shows a semiconductor memory device illustrating a problem caused by propagation delay time differences, with reference to FIG. 1.
Figure 3:
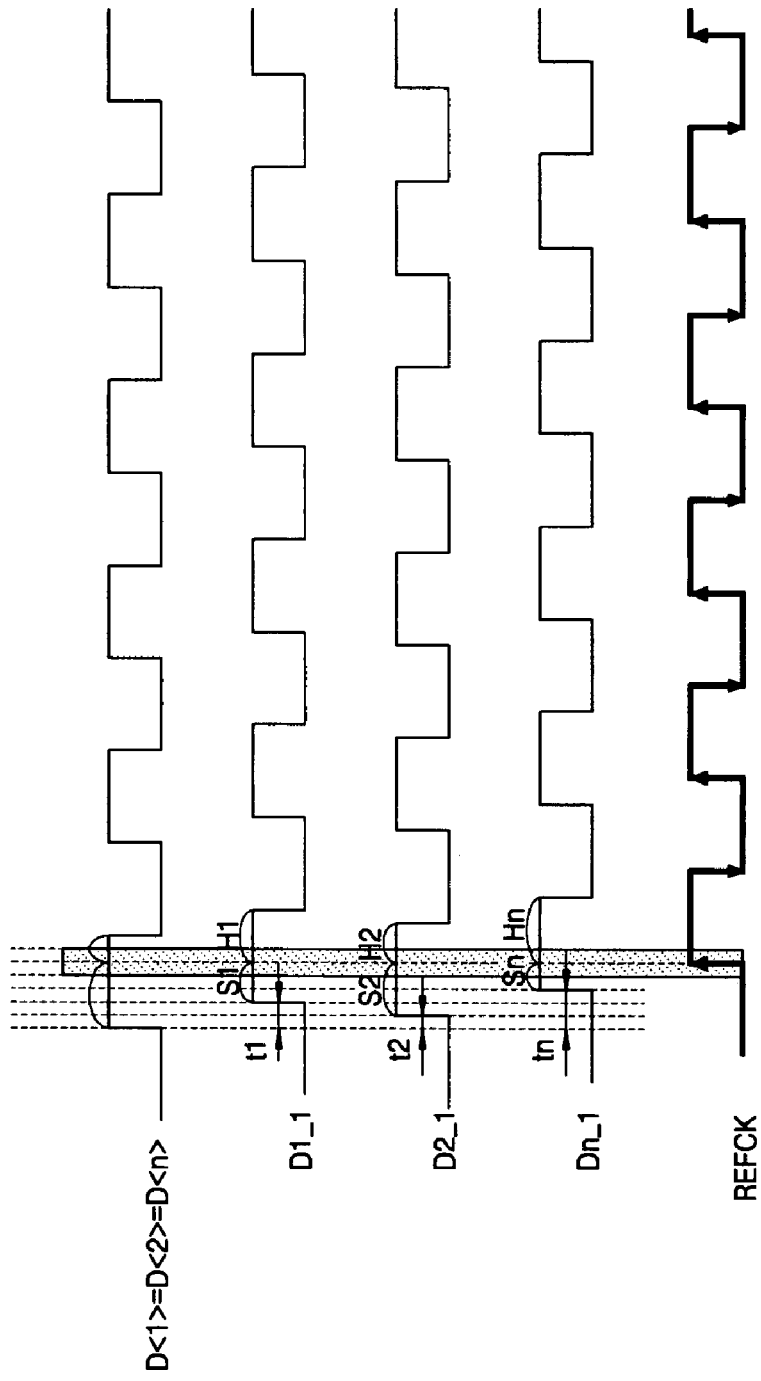
FIG. 3 is a timing diagram illustrating the operation of the semiconductor memory device shown in FIG. 2.
Figure 4A:
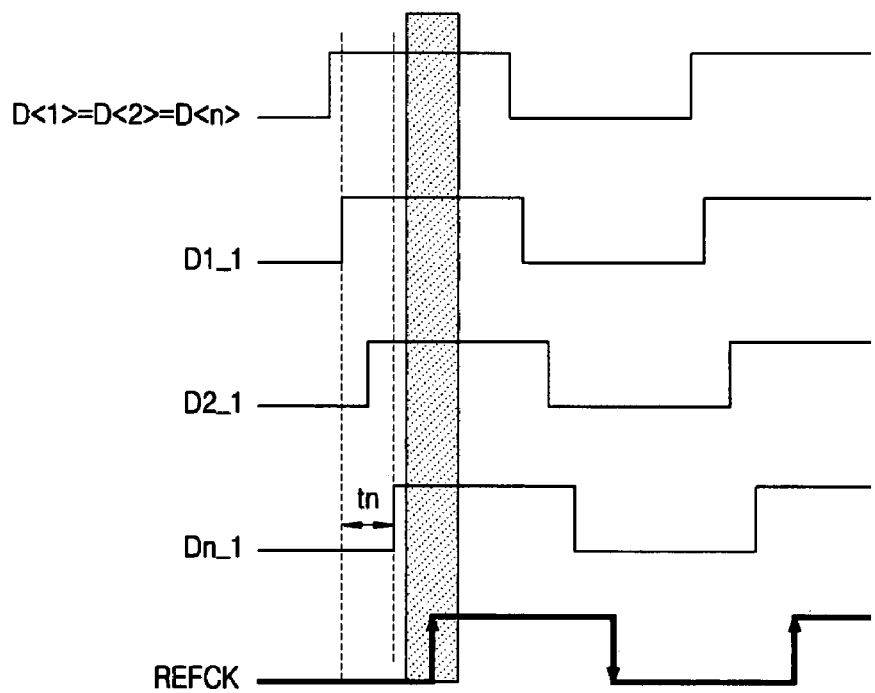
FIG. 4A is a timing diagram illustrating a small propagation delay time difference between data contents in the semiconductor memory device of FIG. 2.
Figure 4B:
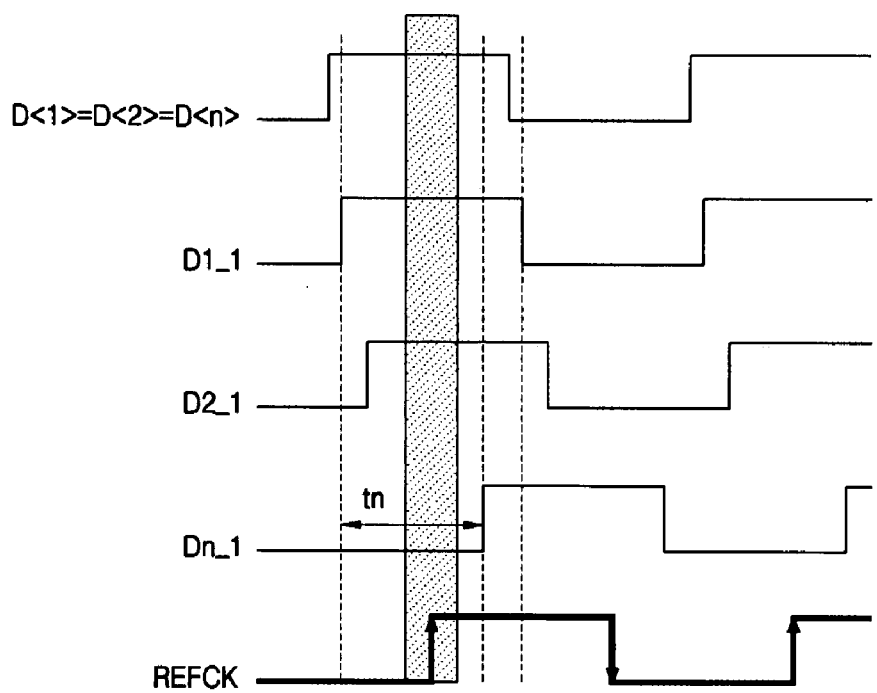
FIG. 4B is a timing diagram illustrating a large propagation delay time difference between data contents in the semiconductor memory device of FIG. 2.

In the same manner as the semiconductor memory device 200 of FIG. 2, the first to nth data bits D<1>, D<2>, ..., D<n> have different propagation delay time periods when they are applied to the semiconductor memory device 500. Data input into the semiconductor memory device 500 operating in the X16 mode has a propagation delay time different from data input into the semiconductor memory device operating in the X1 mode, as described above with reference to FIG. 1. Furthermore, even if the semiconductor memory device 500 operates in one mode (e.g., the X16 mode), multi-bit data contents input into the semiconductor memory device 500 have different propagation delay time periods if internal circuits for receiving the multi-bit data contents are located at different positions (not shown). For one or both of these reasons, the propagation delay time periods t1, t2 and tn of the first to nth data bits D<1>, D<2>, ..., D<n> input into the semiconductor memory device 500 shown in FIG. 5 can vary.

The first data storage unit DS1 receives and stores the first to nth data bits D<1>, D<2>, ..., D<n> applied to the semiconductor memory device 500 in response to the latch clock signal LCK. The first data storage unit DS1 includes first to nth storage elements FF11, FF21, ..., FFn1, that are flip-flops. The latch clock signal LCK has first to nth sub latch clock signals SLCK1, SLCK2, ..., SLCKn that are generated at different times depending on the respective propagation delay time periods of the first to nth data bits D<1>, D<2>, ..., D<n>. The first to nth sub latch clock signals SLCK1, SLCK2, ..., SLCKn may be obtained by delaying the reference clock signal REFCK and varying the magnitude of delay according to the propagation delay time periods of the first to nth data bits D<1>, D<2>, ..., D<n>.

The first to nth data bits D<1>, D<2>, ..., D<n> are respectively input into the first to nth storage elements FF11, FF21, ..., FFn1 of the first data storage unit DS1 and have different propagation delay time periods. Some of the first to nth data bits D<1>, D<2>, ..., D<n> cannot be latched using only the reference clock signal REFCK. Accordingly, the semiconductor memory device 500 shown in FIG. 5 includes first to nth programmable delays PD1, PD2, ..., PDn respectively corresponding to the first to nth storage elements FF11, FF21, ..., FFn1 that receive and store the first to nth data bits D<1>, D<2>, ..., D<n>. The first to nth programmable delays PD1, PD2, ..., PDn delay the reference clock signal REFCK to generate the first to nth sub latch clock signals SLCK1, SLCK2, ..., SLCKn, respectively.

The first to nth programmable delays PD1, PD2, ..., PDn determine the delay time of the reference clock signal REFCK according to the propagation delay time of the first to nth data bits D<1>, D<2>, ..., D<n>. Specifically, the first programmable delay PD1 may generate the first sub latch clock signal SLCK1 at the proper time for the first storage element FF11 to latch the first data bit D<1> in consideration of the propagation delay time t1 of the first data bit D<1>. Likewise, the second programmable delay PD2 may generate the second sub latch clock signal SLCK2 at the proper time for the second storage element FF21 to latch the second data bit D<2> in consideration of the propagation delay time t2 of the second data bit D<2>. Similarly, the nth programmable delay PDn generates the nth sub latch clock signal SLCKn at the proper time for the nth storage element FFn1 to latch the nth data bit D<n> in consideration of the propagation delay time tn of the nth data bit D<n>.

In FIG. 5, the second data bit D<2> has the shortest propagation delay time and the nth data bit D<n> has the longest delay time. The propagation delay time of the first data bit D<1> is in between the delay time of the first data bit D<1> and second data bit D<2>. Thus, the second sub latch clock signal SLCK2 is generated first, which is followed by generation of the first sub latch clock signal SLCK1, and the nth sub latch clock signal SLCKn is created last, as illustrated in FIG. 6.

Referring to FIGS. 5 and 6, the first to nth storage elements FF11, FF21, FFn1 store the first to nth data bits D<1>, D<2>, ..., D<n> in response to the respective first to nth sub latch clock signals SLCK1, SLCK2, . . . , SLCKn. Accordingly, set-up and hold time characteristics S1, H1, S2, H2, . . . , Sn, Hn of the first to nth data bits D<1>, D<2>, . . . , D<n> may be improved.

The first to nth data bits D<1>, D<2>, . . . , D<n> are stored in the first to nth storage elements FF11, FF21, . . . , FFn1 in response to a set of the first to nth sub latch clock signals SLCK1, SLCK2, . . . , SLCKn. The second data storage unit DS2 then stores the first to nth data bits D<1>, D<2>, . . . , D<n> output from the first to nth storage elements FF11, FF21, . . . , FFn1 in response to the reference clock signal REFCK. All of the flip-flops other than the storage elements of the first data storage unit DS1, (e.g., FF12, FF22, . . . , FFn2, FF13, FF23, . . . , FFn3) store the corresponding first to nth data bits D<1>, D<2>, . . . , D<n>, in response to the reference clock signal REFCK. The problems of different propagation delay times is only an issue for storage elements FF11, FF21, . . . , FFn1 arranged at the very front stage of the semiconductor memory device 500. Accordingly, flip-flops (other than the storage elements of the first data storage unit DS1) can operate according to the uniform reference clock signal REFCK.

The first to nth programmable delays PD1, PD2, . . . , PDn may determine the magnitude of delay of the reference clock signal REFCK for generating the first to nth sub latch clock signals SLCK1, SLCK2, . . . , SLCKn using a fuse option. For example, the circuit designer of the semiconductor memory device 500 may know the propagation delay time periods t1, t2 and tn of the first to nth data bits D<1>, D<2>, . . . , D<n>, and the first to nth programmable delays PD1, PD2, . . . , PDn may be constructed to include fuses. These fuses may be connected or disconnected as required to set the proper amount of delay of the reference clock signal REFCK.

Beneficially, the first to nth programmable delays PD1, PD2, . . . , PDn may set the amount of delay of the reference clock signal REFCK for generating the first to nth sub latch clock signals SLCK1, SLCK2, . . . , SLCKn according to MRS (Mode Register Set) data. That is, because the circuit designer of the semiconductor memory device 500 knows the propagation delay time periods t1, t2 and tn of the first to nth data bits D<1>, D<2>, . . . , D<n>, the first to nth programmable delays PD1, PD2, . . . , PDn can be set to control the amount of delay of the reference clock signal REFCK using the MRS.

So, the flip-flops FF11, FF21, . . . , FFn1 of the first data storage unit DS1 of the semiconductor memory device 500 shown in FIG. 5 latch data in response to the first to nth sub latch clock signals SLCK1, SLCK2, . . . , SLCKn. The first to nth sub latch clock signals SLCK1, SLCK2, . . . , SLCKn may be generated by delaying the reference clock signal REFCK. Meanwhile, the other flip-flops FF12, FF22, . . . , FFn2, FF13, FF23, . . . , FFn3 may latch data in response to the reference clock signal REFCK. So semiconductor memory device 500 may be considered to be a synchronous system that latches input data in response to a single reference clock signal REFCK, using asynchronous components to prevent loss of data due to propagation delays.

Therefore, the semiconductor memory device 500 can solve problems caused by propagation delay time variations of data in a semiconductor memory device which simultaneously processes various data widths (e.g. X16, X8, X4, X2 and X1 where the delay in the X1 mode is longer than in the X16 mode).

As described above, the semiconductor memory device can increase the margin of data and improve the set-up and hold time characteristics by adjusting the magnitude of delay of a reference clock signal for controlling front-stage flip-flops receiving multi-bit data contents, according to a propagation delay time differences among the multi-bit data contents.

While the present invention has been particularly shown and described with reference to example embodiments, it will be understood by those of ordinary skill in the art that various changes in form and details may be made therein without departing from the spirit and scope of the present invention as defined by the following claims.

What is claimed is:

1. A memory device, comprising:
a first data storage unit adapted to store first to nth data bits input into the first data storage unit in response to a latch clock signal; and
a second data storage adapted to store the first to nth data bits output from the first data storage unit in response to a reference clock signal,
wherein the latch clock signal is obtained by delaying the reference clock signal,
wherein the latch clock signal includes first to nth sub latch clock signals corresponding to the first to nth data bits, and
wherein the first to nth sub latch clock signals are generated at different times according to propagation delay time periods of the first to nth data bits.

2. The memory device of claim 1, further comprising first to nth programmable delays which are adapted to delay the reference clock signal to generate the first to nth sub latch clock signals, respectively, and wherein the first data storage unit includes first to nth storage elements which are adapted to store the first to nth data bits in response to the first to nth sub latch clock signals, respectively.

3. The memory device of claim 2, wherein the first to nth programmable delays are adapted to determine delay times of the reference clock signal according to propagation delay times of the first to nth data applied to the first to nth programmable delays.

4. The memory device of claim 2, wherein the first to nth programmable delays are adapted to generate the first to nth sub latch clock signals according to a state of a fuse.

5. The memory device of claim 2, wherein the first to nth programmable delays are adapted to generate the first to nth sub latch clock signals according to MRS (Mode Register Set) data in the memory device.

6. The memory device of claim 1, wherein the number of bits of data input into the semiconductor memory device is selectable according to an operating mode of the semiconductor memory device.

7. A memory device having a plurality of data paths for receiving data, wherein the data paths comprise:
a plurality of data storage units adapted to store data, including
a first stage of data storage units adapted to store the data in response to a latch clock signal, and
at least a second stage of data storage units adapted to store the data output from the first stage of data storage units in response to a reference clock signal; and
delay units adapted to delay the reference clock signal and output the latch clock signal,
wherein the latch clock signal includes a plurality of sub latch clock signals each corresponding to one of the plurality of data paths, and
wherein the sub latch clock signals are generated at different times according to propagation delay times of the data input into the corresponding data paths.

8. The semiconductor memory device as claimed in claim 7, wherein the delay units are programmable.

9. The semiconductor memory device as claimed in claim 8, wherein the plurality of programmable delay units are adapted to determine delay times of the reference clock signal according to propagation delay times of the data input into a corresponding data path.

10. The semiconductor memory device as claimed in claim 8, wherein the latch clock signal includes a plurality of sub latch clock signals, and wherein the programmable delay units are adapted to generate the plurality of sub latch clock signals according to a state of at least one fuse.

11. The semiconductor memory device as claimed in claim 8, wherein the programmable delay units are adapted to generate first to nth sub latch clock signals according to MRS (Mode Register Set) data.

12. The semiconductor memory device as claimed in claim 7, wherein a number of data paths which receive data is selectable according to an operating mode of the semiconductor memory device.

* * * * *